United States Patent
Gans et al.

(10) Patent No.: US 11,568,906 B2
(45) Date of Patent: *Jan. 31, 2023

(54) APPARATUSES AND METHODS FOR STORING AND WRITING MULTIPLE PARAMETER CODES FOR MEMORY OPERATING PARAMETERS

(71) Applicant: MICRON TECHNOLOGY, INC., Boise, ID (US)

(72) Inventors: Dean D. Gans, Nampa, ID (US); Daniel C. Skinner, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/301,531

(22) Filed: Apr. 6, 2021

(65) Prior Publication Data
US 2021/0287724 A1 Sep. 16, 2021

Related U.S. Application Data

(63) Continuation of application No. 16/853,917, filed on Apr. 21, 2020, now Pat. No. 10,978,115, which is a (Continued)

(51) Int. Cl.
*G11C 7/10* (2006.01)
(52) U.S. Cl.
CPC ............ *G11C 7/1045* (2013.01); *G11C 7/109* (2013.01)
(58) Field of Classification Search
CPC .............................. G11C 7/1045; G11C 7/109
See application file for complete search history.

(56) References Cited

U.S. PATENT DOCUMENTS 6,215,725 B1 * 4/2001 Komatsu ............. G11C 7/1045
                                                      365/233.17
8,504,854 B2   8/2013 Naffziger et al.
(Continued)

FOREIGN PATENT DOCUMENTS

CN          101685675 A        3/2010
CN          102543154 A        7/2012
(Continued)

OTHER PUBLICATIONS

EN translation of KR Office Action dated Apr. 10, 2021 for KR Application No. 10-2021-7000754, pp. all.
(Continued)

*Primary Examiner* — Zachary K Huson
(74) *Attorney, Agent, or Firm* — Dorsey & Whitney LLP

(57) ABSTRACT

Apparatuses and methods for writing and storing parameter codes for operating parameters, and selecting between the parameter codes to set an operating condition for a memory are disclosed. An example apparatus includes a first mode register and a second mode register. The first mode register is configured to store first and second parameter codes for a same operating parameter. The second mode register is configured to store a parameter code for a control parameter to select between the first and second parameter codes to set a current operating condition for the operating parameter. An example method includes storing in a first register a first parameter code for an operating parameter used to set a first memory operating condition, and further includes storing in a second register a second parameter code for the operating parameter used to set a second memory operating condition.

20 Claims, 7 Drawing Sheets

Related U.S. Application Data continuation of application No. 16/513,431, filed on Jul. 16, 2019, now Pat. No. 10,629,245, which is a continuation of application No. 16/222,806, filed on Dec. 17, 2018, now Pat. No. 10,424,351, which is a continuation of application No. 15/933,167, filed on Mar. 22, 2018, now Pat. No. 10,157,647, which is a continuation of application No. 14/247,129, filed on Apr. 7, 2014, now Pat. No. 9,934,831.

(56) References Cited

U.S. PATENT DOCUMENTS

| | | | |
|---|---|---|---|
| 8,645,743 | B2 | 2/2014 | Machnicki et al. |
| 9,934,831 | B2* | 4/2018 | Gans ............... G11C 7/1045 |
| 10,157,647 | B2 | 12/2018 | Gans et al. |
| 10,424,351 | B2 | 9/2019 | Gans et al. |
| 10,629,245 | B2 | 4/2020 | Gans et al. |
| 10,978,115 | B2 | 4/2021 | Gans et al. |
| 2005/0144372 | A1* | 6/2005 | Walker ............... G06F 13/1694 711/105 |
| 2006/0120139 | A1 | 6/2006 | Perner et al. |
| 2006/0152957 | A1 | 7/2006 | Schaefer |
| 2007/0162682 | A1* | 7/2007 | Abe ............... G06F 12/0646 711/E12.084 |
| 2008/0056051 | A1 | 3/2008 | Mayer et al. |
| 2008/0320267 | A1 | 12/2008 | Bilger et al. |
| 2009/0085604 | A1 | 4/2009 | David |
| 2010/0054053 | A1 | 3/2010 | Lee et al. |
| 2010/0208534 | A1 | 8/2010 | Fujisawa |
| 2013/0132689 | A1 | 5/2013 | Pax |
| 2013/0201779 | A1 | 8/2013 | Wen |
| 2013/0246820 | A1 | 9/2013 | Branover et al. |
| 2013/0311717 | A1 | 11/2013 | Kim et al. |
| 2014/0006729 | A1 | 1/2014 | Cox et al. |
| 2014/0059287 | A1 | 2/2014 | Bains et al. |
| 2014/0281294 | A1 | 9/2014 | Dai et al. |
| 2014/0281394 | A1* | 9/2014 | Smith ............... G06F 9/30054 712/208 |
| 2015/0286593 | A1 | 10/2015 | Gans |
| 2016/0124873 | A1 | 5/2016 | Xu et al. |
| 2018/0211695 | A1 | 7/2018 | Gans et al. |
| 2019/0122707 | A1 | 4/2019 | Gans et al. |
| 2019/0341085 | A1 | 11/2019 | Gans et al. |
| 2020/0312387 | A1 | 10/2020 | Gans et al. |

FOREIGN PATENT DOCUMENTS

| | | |
|---|---|---|
| CN | 102693756 A | 9/2012 |
| TW | 201346546 A | 11/2013 |
| WO | 2013095518 A1 | 6/2013 |
| WO | 2013109284 A1 | 7/2013 |
| WO | 2015157028 A1 | 10/2015 |

OTHER PUBLICATIONS

Fourth Office Action dated May 11, 2021 for EP Application No. 15776696.5, pp. all.

U.S. Appl. No. 16/513,431 titled "Apparatuses and Methods for Storing and Writing Multiple Parameter Codes for Memory Operating Parameters", filed Jul. 16, 2019, pp. all.

U.S. Appl. No. 16/853,917 titled "Apparatuses and Methods for Storing and Writing Multiple Parameter Codes for Memory Operating Parameters", filed Apr. 21, 2020, pp. all.

EN translation of KR Office Action dated Nov. 10, 2020 for KR Application No. 10-2020-7023163, pp. all.

English Translation of First Office Action; Korean Application No. 10-2018-7027305, dated Jun. 26, 2019, pp. all.

Extended European Search Report dated Oct. 18, 2017 for Application No. 15776696.5, pp. all.

First Office Action dated March 8, 2019 for CN Application No. 201580026601.2; pp. all.

First Office Action dated Nov. 22, 2018 for EP Application No. 15776696.5, 10 pgs.

Preliminary Rejection dated Nov. 16, 2017 for Korean Application No. 10-2016-7030747, pp. all.

Second Office Action dated Sep. 25, 2019 for EP Application No. 15776696.5, 6 pgs.

Third Office Action dated Sep. 4, 2020 for EP Application No. 15776696.5, pp. all.

U.S. Appl. No. 16/222,806 titled "Apparatuses and Methods for Storing and Writing Multiple Parameter Codes for Memory Operating Parameters", filed Dec. 17, 2018, pp. all.

International Search Report & Written Opinion dated Jun. 11, 2015 issued for PCT/US2015/023516, 15 pgs.

First Office Action for ROC (Taiwan) Pat. Appln. No. 104111151 dated Aug. 22, 2016, pp. all.

Second Office Action for ROC (Taiwan) Pat. Appln. No. 104111151 dated May 1, 2017, pp. all.

EN translation KR Office Action dated Oct. 28, 2021 for KR Appl. No. 10-2021-7000754; pp. all.

\* cited by examiner

SP0

| PARAMA – SP0 210 (A0) | PARAMB – SP0 220 (B0) | PARAMC – SP0 220 (C0) |

| PARAMA – SP1 210 (A1) | PARAMB – SP1 220 (B1) | PARAMC – SP1 220 (C1) |

Fig. 3B

APPARATUSES AND METHODS FOR STORING AND WRITING MULTIPLE PARAMETER CODES FOR MEMORY OPERATING PARAMETERS

CROSS-REFERENCE TO RELATED APPLICATION(S)

This application is a continuation of U.S. patent application Ser. No. 16/853,917 filed Apr. 21, 2020, issued as U.S. Pat. No. 10,978,115 on Apr. 13, 2021, which is a continuation of U.S. patent application Ser. No. 16/513,431 filed Jul. 16, 2019, issued as U.S. Pat. No. 10,629,245 on Apr. 21, 2020, which is a continuation of U.S. patent application Ser. No. 16/222,806 filed Dec. 17, 2018, issued as U.S. Pat. No. 10,424,351 on Sep. 24, 2019, which is a continuation of U.S. patent application Ser. No. 15/933,167, filed Mar. 22, 2018, issued as U.S. Pat. No. 10,157,647 on Dec. 18, 2018, which is a continuation of U.S. patent application Ser. No. 14/247,129, filed Apr. 7, 2014, issued as U.S. Pat. No. 9,934,831 on Apr. 3, 2018. The aforementioned applications, and issued patents, are incorporated by reference herein in their entirety and for any purposes.

BACKGROUND

Electronic memories are used in many electronic systems to store information, for example, in electronic systems such as a mobile phone, a tablet, a computer, a server, as well as electronic systems including a processor or having a need to store information. The memory may be controlled through memory commands, such as write commands and read commands, that are received by the memory over a command bus. The information to be stored may be written to the memory using write commands, and retrieved at a later time by reading the information from the memory using read commands.

The circuits of an electronic system, including the memory, often operate according to a common clock. As known, a memory may be operated at different clock frequencies, such as a relatively high clock frequency (e.g., greater than 500 MHz), as well as at a lower frequency, which may reduce power consumption. However, the memory may need to have different operating conditions for proper operation at the different clock frequencies. That is, the memory operating conditions may need to be changed when the clock frequency changes. In some cases, memory operating conditions related to receiving memory commands over a command bus should be changed prior to the change in clock frequency in order to maintain communication with the memory, and for the memory to continue to operate properly.

Typically, the memory includes mode registers that store parameter codes for various operating and control parameters that are used to set the operating condition for the memory. The parameter codes may be written to the mode registers by way of mode register write operations. Examples of operating and control parameters include parameters related to burst length, preamble and postamble length, read and write latencies, on-die termination settings, reference voltage settings, as well as others. Changing the memory operating condition may involve writing new parameter codes for the operating and control parameters before the memory can properly operate under a new conditions, for example, with a new clock frequency. Changing the parameter codes for the various operating parameters can require several mode register write operations, which can delay when the memory can operate under the new condition. Additionally, the parameter codes for some of the operating parameters may need to be changed at the same time in order to maintain control over the memory, further complicating operation of the memory under a new condition.

BRIEF DESCRIPTION OF THE DRAWINGS

FIG. 3A is a diagram of registers storing parameter codes for operating parameters of a first set point according to an embodiment of the invention. FIG. 3B is a diagram of registers storing parameter codes for operating parameters of a second set point according to an embodiment of the invention.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1A:
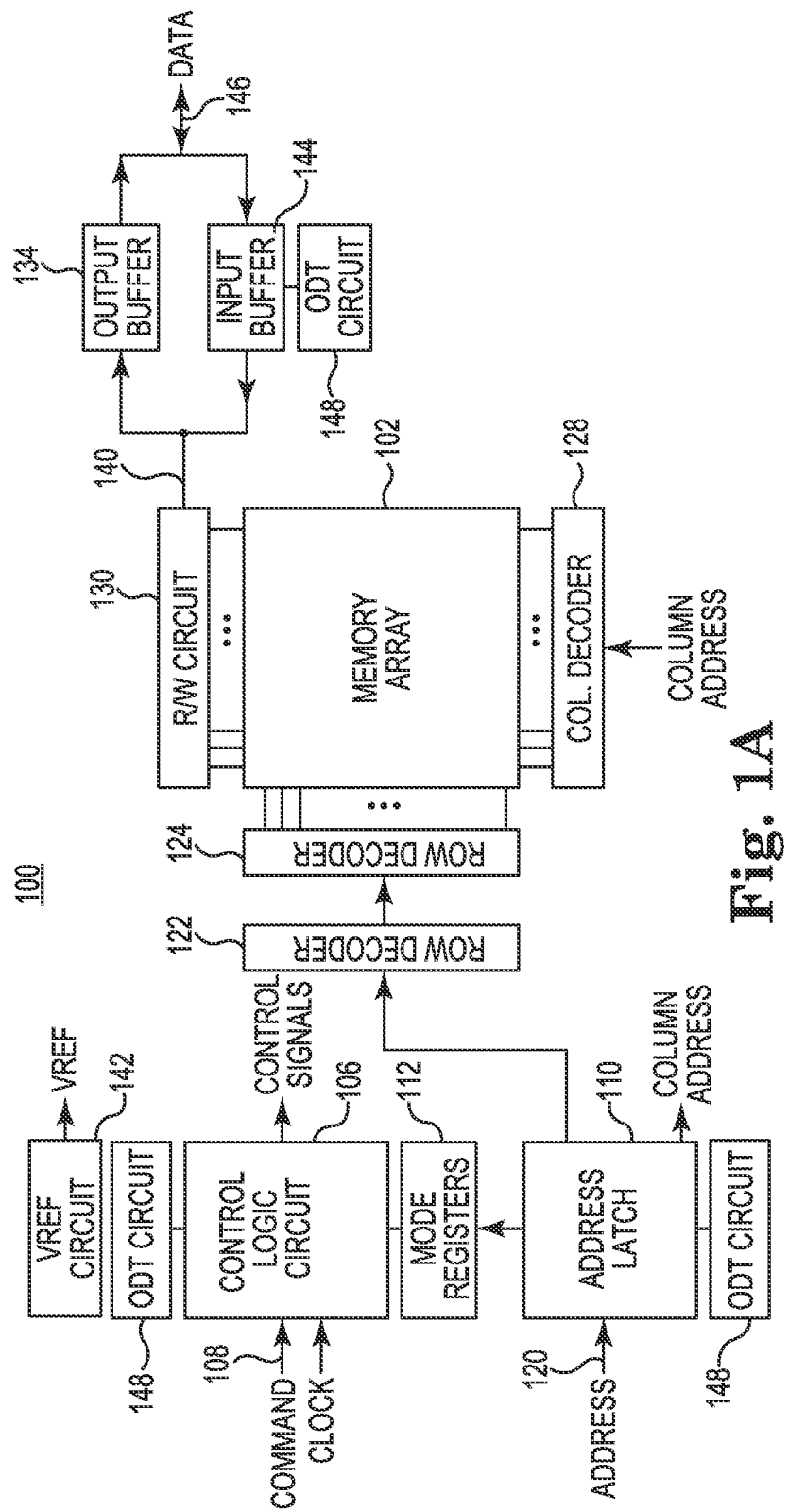
FIG. 1A is a block diagram of an apparatus including a memory according to an embodiment of the invention.

FIG. 1A illustrates an apparatus that includes a memory 100 according to an embodiment of the present invention. As used herein, apparatus may refer to, for example, an integrated circuit, a memory device, a memory system, an electronic device or system, a smart phone, a tablet, a computer, a server, etc. The memory 100 includes an array 102 of memory cells, which may be, for example, volatile memory cells (e.g., DRAM memory cells, SRAM memory cells, etc.), non-volatile memory cells (e.g., flash memory cells, PCM cells, etc.), or some other types of memory cells. The memory 100 includes a control logic circuit 106 that receives memory commands through a command bus 108 and generates corresponding control signals within the memory 100 to carry out various memory operations. The control logic circuit 106 may further receive a clock signal that is used for timing operations of the memory 100. In some embodiments, internal timing of operations may be provided based on a signal provided to the memory that is other than a clock signal, for example, a strobe signal (not shown in FIG. 1). The control logic circuit 106 responds to memory commands applied to the command bus 108 to perform various operations on the memory array 102. For example, the control logic circuit 106 is used to provide internal control signals to read data from and write data to the memory array 102.

A mode register 112 stores information that is used by the control logic circuit 106 to configure operation of the memory 100, for example, for setting operating conditions for the memory 100. The mode register 112 includes registers to store parameter codes for various operating and control parameters that are used to set an operating condition of the memory 100. Examples of operating and control parameters include parameters related to burst length, preamble and postamble length, read and write latencies, on-die termination settings, reference voltage settings, as well as others. The parameter codes may be written to the mode register 112 using mode register commands. In some embodiments, the parameter codes may be received by the memory 100 over an address bus. The parameter codes may be received in other manners as well. The control logic circuit 106 provides internal control signals to the circuits of the memory 100 to operate as set by the operating parameters stored by the mode register 112.

As will be described in more detail below, the mode register 112 includes registers to store multiple parameter codes for one or more operating parameters. That is, some operating parameters have multiple operating codes stored for them. The mode register 112 further includes registers to store parameter codes for control parameters to select between the registers for the multiple parameter codes. One of the control parameters is used to select which of the multiple operating codes for the one or more operating parameters are used by the control logic circuit 106 to set a current operating condition for the memory 100. Another one of the control parameters is used to select which of the registers parameter codes for the one or more operating parameters is written by the control logic circuit 106 for a mode register write operation. The multiple parameter codes for the one or more operating parameters, and the control parameters for selecting which of the parameter codes to use and to write, facilitate relatively quick switching of operating conditions for the memory 100. In some embodiments, the parameter codes for multiple operating parameters may be switched from one code to another simultaneously (e.g., within a time period of one another), thus changing from one memory operating condition to another memory operating condition quickly.

Row and column address signals are received by the memory 100 through an address bus 120 and are latched in an address latch 110. The address latch 110 then outputs a separate column address and a separate row address. The row and column addresses are provided by the address latch 110 to a row address decoder 122 and a column address decoder 128, respectively. Parameter codes may be received by the address latch 110 as well, and written to the mode registers 112 for mode register write operations. The column address decoder 128 selects access lines extending through the array 102 corresponding to respective column addresses. The row address decoder 122 is connected to access line driver 124 that activates respective rows of memory cells in the array 102 corresponding to received row addresses. The selected access line corresponding to a received column address are coupled to a read/write circuitry 130 to provide read data to a data output buffer 134 via an input-output data bus 140. The read data is provided by the data output buffer 134 over data bus 146. Write data are applied to the memory array 102 through a data input buffer 144 coupled to the data bus 146, and through the memory array read/write circuitry 130.

On-die termination (ODT) circuits 148 provide termination resistance when enabled for the command and address busses 108 and 120, and the data bus 146. The termination resistance may improve signal integrity of signals received by the memory 100 over the busses. Enablement of the ODT circuits 148, and the magnitude of termination resistance provided to the busses, may be set by writing appropriate parameter codes in the mode register 112. The memory 100 may include a VREF circuit 142 that provides an reference voltage VREF for use by the circuits of the memory 100. In some embodiments, the VREF circuit 142 may not be included. For example, the reference voltage VREF may be used by the control logic circuit 106 to compare against the voltage of signals received from the command bus 108 to determine logic values of the received signals. The reference voltage VREF may be set, or a range for the reference voltage set by writing the appropriate parameter code for a reference voltage operating parameter in the mode registers 112.

Figure 1B:
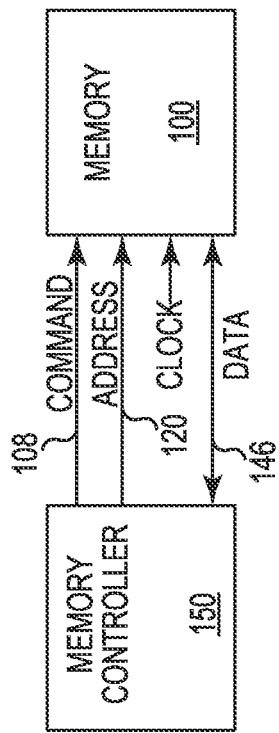
FIG. 1B is a block diagram of an apparatus including a memory controller and further including a memory according to an embodiment of the invention.

FIG. 1B illustrates an apparatus that includes the memory 100 and a memory controller 150. The memory controller 150 is configured to provide memory commands and addresses to the memory 100 over the command and address busses 108 and 120. Data is provided from the memory 100 to the memory controller 150 over a data bus 146 for read commands, and data is provided from the memory controller 150 to the memory 100 over the data bus 146 for write commands. The memory controller 150 may provide the memory 100 with mode register write commands and parameter codes to write the parameter codes to the mode register of the memory 100. The parameter codes for the operating and control parameters are stored and are used to set operating conditions for the memory 100, as previously described. In some embodiments, rather than the memory controller 150 providing memory commands, addresses, and data to a memory (e.g., the memory 100), the memory controller 150 provides the memory commands, addresses, and data to a logic circuit (not shown) that is included in a memory subsystem with a memory. The logic circuit may receive the memory commands, addresses, and data and provide a memory with signals for operating the memory accordingly.

Figure 2:
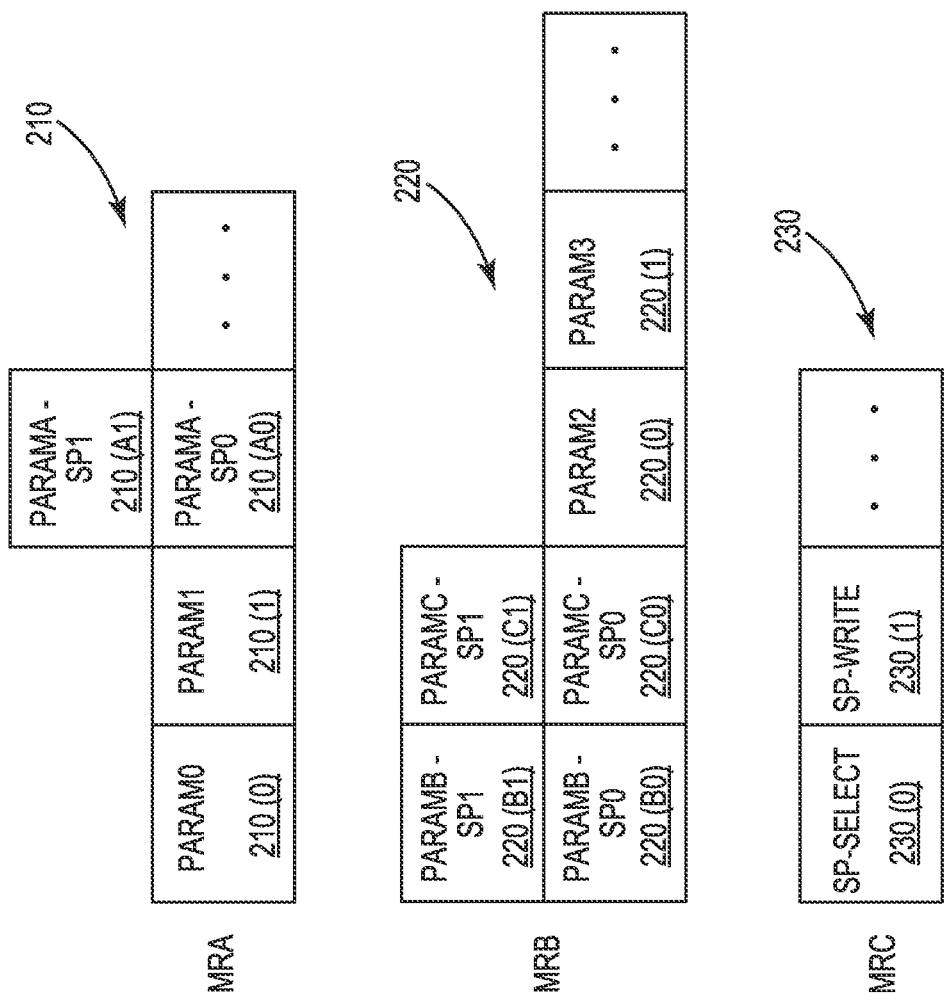
FIG. 2 is a block diagram of mode registers of a memory according to an embodiment of the invention.

FIG. 2 illustrates a portion of the mode registers 112 according to an embodiment of the invention. Mode registers 210, 220, and 230 may be included in the mode registers 112. The mode registers 210, 220, and 230 represent a group of registers that are associated with a respective mode register, which may in turn be identified by a respective mode register address. In the embodiment of FIG. 2, mode register 210 is identified by mode register address MRA, mode register 220 is identified by mode register address MRB, and mode register 230 is identified by mode register address MRC. The registers store parameter codes for various operating parameters and control parameters used, for example, by the control logic circuit 106 to set a current operating condition for the memory device. For example, registers 210(0), 210(1), 210(A0) and 210(A1) may store parameter codes for operating parameters PARAM0, PARAM1, PARAMA-SP0, and PARAMA-SP1, respectively. Registers 220(B0), 220 (B1), 220(C0), 220(C1), 220(0), and 220(1) may store parameter codes for operating parameters PARAMB-SP0, PARAMB-SP1, PARAMC-SP0, PARAMC-SP1, PARAM2, and PARAM3, respectively. The parameter codes for the operating parameters may be written to the respective registers responsive to a mode register write operation to the particular register.

Some of the operating parameters may have more than one parameter code stored, where each parameter code represents a different setting for the operating parameter. For example, two, three, four, or more parameter codes may be stored for some operating parameters. In the embodiment of FIG. 2, for example, two parameter codes are stored for operating parameter PARAMA by registers 210(A0) and 210(A1). Likewise, there are two parameter codes stored for operating parameter PARAMB by registers 220(B0) and 220(B1), and two parameter codes stored for operating parameter PARAMC by registers 220(C0) and 220(C1). The parameter codes stored by registers 210(A0), 220(B0), and 220(C0) for operating parameters PARAMA, PARAMB, and PARAMC may be for a first set point SP0, and the parameter codes stored by registers 210(A1), 220(B1), and 220(C1) for operating parameters PARAMA, PARAMB, and PARAMC may be for a second set point SP1. The set points may be associated with a respective operating condition, for example, the first set point SP0 may be associated with a first operating condition and the second set point SP1 may be associated with a second operating condition. As will be explained in more detail below, one of the two different set points for the operating parameters PARAMA, PARAMB, and PARAMC may be selected for setting current memory operating conditions for the memory. Selection of which operating parameters to use may be through the use of control parameters stored by registers of mode register 230.

The parameter codes for the operating parameters may be represented by one or more bits (binary digits) of information, and the registers for the different operating parameters may store one or more bits of information. For example, operating parameter PARAM0 may be represented by a 1-bit parameter code and the register 210(0) may store 1-bit of information, whereas operating parameter PARAM1 may be represented by a 2-bit parameter code and the register 210(1) may store 2-bits of information. The operating parameters may be represented by greater or fewer bits in other embodiments as well.

The mode register 230 includes registers 230(0) and 230(1) for storing parameter codes for control parameters SP-SELECT and SP-WRITE. The parameter code for the control parameter SP-SELECT may be 1-bit. The parameter code for the control parameter SP-WRITE may be 1-bit. In other embodiments, however, the parameter codes for the control parameters SP-SELECT and SP-WRITE may be more than one bit.

The control parameter SP-SELECT may be used to select which of the set points for operating parameters PARAMA, PARAMB, and PARAMC are used to set current memory operating conditions for the memory. For example, a parameter code of "0" written to the register 230(0) may select the first set point SP0 of operating parameters PARAMA, PARAMB, and PARAMC to set current memory operating conditions. That is, as illustrated in FIG. 3A, the parameter codes stored by registers 210(A0), 220(B0), and 220(C0) may be used to set the operating parameters PARAMA, PARAMB, and PARAMC for current memory operating conditions. In contrast, a parameter code of "1" written to the register 230(0) may select the second set point SP1 of operating parameters PARAMA, PARAMB, and PARAMC to set current memory operating conditions. As illustrated in FIG. 3B, the parameter codes stored by registers 210(A1), 220(B1), and 220(C1) may be used to set the operating parameters PARAMA, PARAMB, and PARAMC for current memory operating conditions. Writing the parameter code to the registers 230(0) for the control parameter SP-SELECT may cause the control logic circuit 106 to switch the parameter codes for all of the operating parameters PARAMA, PARAMB, and PARAMC simultaneously (e.g., the parameter codes for the operating parameters PARAMA, PARAMB, and PARAMC are all switched within a time period, for example, 100 ns, of one another), thus quickly changing the memory operating condition from one to another. Multiplexers may be coupled to the registers storing the multiple parameter codes for those operating parameters having multiple parameter codes, and provide the selected parameter codes to the control logic circuit 106 based on the control parameter SP-SELECT. For example, the logic value of the control parameter SP-SELECT may be used to control the multiplexers to provide the selected parameter codes to the control logic circuit 106 to set the memory operating condition.

The control parameter SP-WRITE may be used to select which of the set points for operating parameters PARAMA, PARAMB, and PARAMC are written when a mode register write operation is performed. For example, a parameter code of "0" stored by the register 230(1) may cause operating parameters PARAMA, PARAMB, and PARAMC for the first set point SP0 to be written when writing parameter codes to mode register 210, and to mode register 220, respectively. That is, when a "0" is stored for the control parameter SP-WRITE, a mode register write operation to mode register 210 using mode register address MRA will cause new parameter codes to be written to registers 210(0), 210(1), and 210(A0) for operating parameters PARAM0, PARAM1, and PARAMA. A mode register write operation to mode register 220 using mode register address MRB will cause new parameter codes to be written to registers 220 (B0), 220(C0), 220(0), and 220(1) for operating parameters PARAMB, PARAMC, PARAM2, PARAM3. In contrast, a parameter code of "1" stored by the register 230(1) may cause operating parameters PARAMA, PARAMB, and PARAMC for the second set point SP1 to be written when writing parameter codes to mode register 210, and to mode register 220, respectively. That is, when a "1" is stored for the control parameter SP-WRITE, a mode register write operation to mode register 210 will cause new parameter codes to be written to registers 210(0), 210(1), and 210(A1) for operating parameters PARAM0, PARAM1, and PARAMA. A mode register write operation to mode register 220 will cause new parameter codes to be written to registers 220(B1), 220(C1), 220(0), and 220(1) for operating parameters PARAMB, PARAMC, PARAM2, PARAM3.

As illustrated by the previous example, while a mode register write operation, for example, for mode register 210 is used to write control parameters (e.g., PARAMA-SP0, PARAMA-SP1) for operating parameter PARAMA, which one of the registers (e.g., 210(A0), 210(A1)) is written responsive to the mode register write operation to mode register address MRA may be based at least in part on the logic value of the control parameter SP-WRITE. Similarly, while a mode register write operation for mode register 220 is used to write control parameters (e.g., PARAMB-SP0, PARAMB-SP1, PARAMC-SP0, PARAMC-SP1) for operating parameters PARAMB and PARAMC, which of the registers (e.g., 220(B0), 220(B1), 220(C0), 220(C1)) is written responsive to the mode register write operation to mode register address MRB may be based at least in part on the logic value of the control parameter SP-WRITE.

FIG. 2 illustrates mode registers 210, 220, and 230, however, greater or fewer mode registers may be included in other embodiments of the invention. Additionally, each mode register 210, 220, and 230 may include registers for storing operating parameters and control parameters other than those illustrated in FIG. 2. The number of operating parameters stored by the mode registers 210, 220, and 230 may be greater or fewer than those shown as well. While FIG. 2 illustrates two registers for storing two different parameter codes for some of the operating parameters (e.g., PARAMA, PARAMB, PARAMC), in some embodiments additional registers may be included for storing more than two different parameter codes for some of the operating parameters. For example, registers may be included to store three, four, or more parameter codes for some of the operating parameters. Thus, embodiments of the invention are not limited to storing two parameter codes for some operating parameters. Including additional registers for storing the parameter codes provides an increased number of set points from which to select to set a memory operating condition. Registers for storing the control parameters SP-SELECT and SP-WRITE may need to be increased as well to store additional bits of the parameter codes needed to adequately select from the stored set points to set the memory operating condition, as well as to select which registers to write parameter codes for a mode register write operation. For example, 1-bit control parameters SP-SELECT and SP-WRITE may be used to select the parameter codes of one of two different set points, whereas 2-bit control parameters for SP-SELECT and SP-WRITE may be used to select the parameter codes of one of up to four different set points. Increasing the number of bits for the control parameters allows for selection from a greater number of different set points.

The operating parameters of the mode registers 210, 220 and 230 may include operating parameters that are known by those ordinarily skilled in the art. For example, the operating parameters may include:

1. BL (burst length)
2. WR-PRE (write preamble)
3. RD-PRE (read preamble)
4. nWR (write recovery for auto precharge)
5. PST (postamble)
6. RL (READ latency)
7. WL (WRITE latency)
8. WLS (WRITE latency set)
9. PDDS (pull-down drive strength and receiver termination)
10. DBI-RD (DBI-read enable)
11. DBI-WR (DBI-write enable)
12. DQ-ODT (DQ ODT value)
13. CA-ODT (CA ODT value)
14. VREF-CA (VREF(CA) value)
15. VR-CA (VREF(CA) range)
16. VREF-DQ (VREF(DQ) value)
17. VR-DQ (VREF(DQ) range)
18. SoC-ODT Other operating parameters not previously described may be included as well.

As previously discussed, various operating parameters associated with a mode register may have multiple parameter codes stored by registers, where each parameter code stored for the particular operating parameter may be for a different set point. Such operating parameters are shown in FIG. 2 as operating parameters PARAMA, PARAMB, and PARAMC. Some embodiments may include greater or fewer operating parameters having multiple parameter codes stored than those shown in FIG. 2. Which of the stored parameter codes, that is, which of the set points used to set a current operating condition, may be selected by a control parameter, such as SP-SELECT previously described.

In some embodiments, the operating parameters having multiple parameter codes stored may correspond to operating parameters 1 through 18 expressly listed previously. In some embodiments, the operating parameters having multiple parameter codes stored may include operating parameters that should be switched from one parameter code to another simultaneously in order to maintain communication with and control over the memory. For example, the operating parameters having multiple parameter codes stored may include operating parameters related to command and/or address information, for example, CA-ODT which is related to on-die termination for command nodes to which command are provided, and VREF-CA which is related to a reference voltage for the command node. Other operating parameters 1-12 and 15-18 expressly listed may be operating parameters that do not have multiple parameter codes stored. In other embodiments, one or more of the operating parameters 1 through 18 may have multiple parameter codes stored, while other ones of the operating parameters do not have multiple parameter codes stored.

In operation, parameter codes for the operating parameters may be written to the registers using mode register write operations. A control parameter may be used to control which registers of an operating parameter having more than one operating code stored are written responsive to the mode register write operation. A parameter code that corresponds to the desired registers may be written for the control parameter. The parameter codes are stored by the registers and may be used to set a current memory operating condition. For operating parameters having more than one parameter code stored by the registers, which of the stored parameter codes for the operating parameter may be selected by writing a parameter code for a control parameter corresponding to the desired parameter codes for the operating parameter.

As previously described, a memory may be operated at different clock frequencies, such as a relatively high clock frequency (e.g., greater than 500 MHz), as well as at a lower frequency. However, the memory may need to have different operating conditions for proper operation at the different clock frequencies. Consequently, the operating conditions may need to be changed in order for continued proper memory operation. Operating conditions related to receiving memory commands from a command bus may need to be changed before the clock frequency changes in order to maintain communication with and control over the memory. Storing parameter codes for the operating parameters for multiple operating conditions, and having a control parameter to select between the multiple operating conditions allows for relatively quick changes in the current memory operating condition. For example, the parameter codes for a first operating condition related to a first clock frequency and for a second operating condition related to a second clock frequency (different than the first clock frequency), may be stored by registers of the mode registers. The control parameter may be used to select between the parameter codes of the first and second operating conditions to set a current memory operating condition, as needed for operating with the particular clock frequency.

Figure 4:
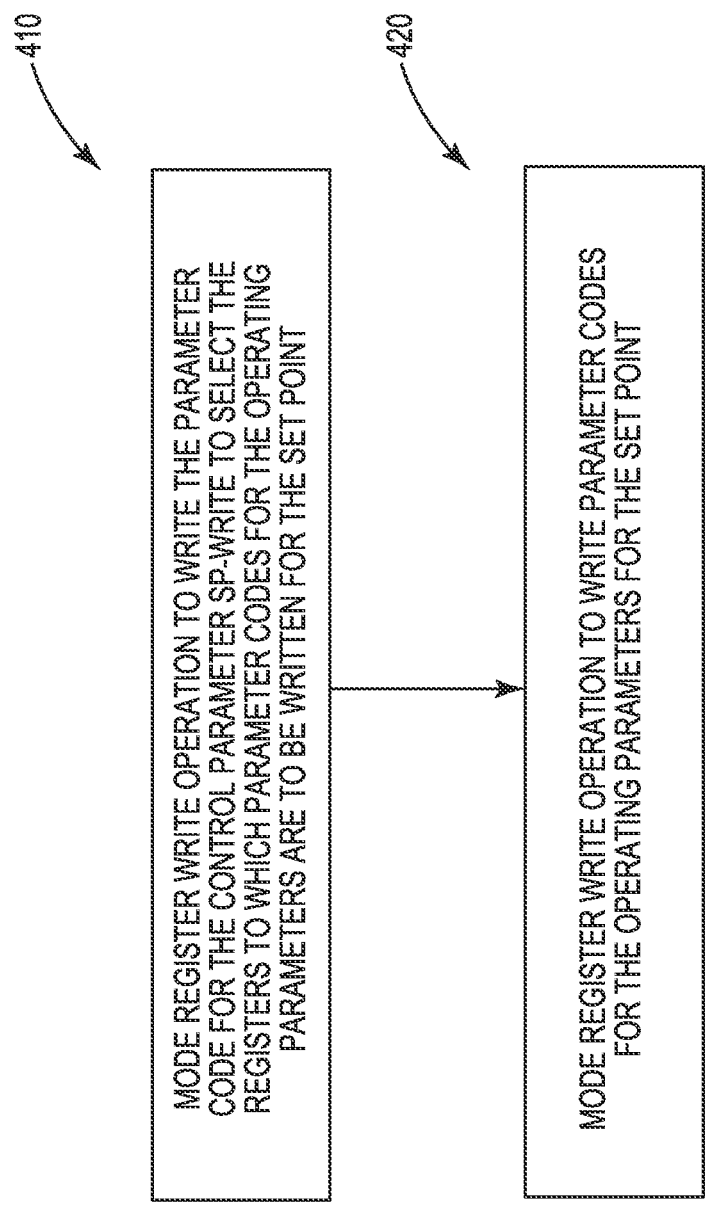
FIG. 4 is a flow diagram for writing parameter codes to mode registers for operational parameters according to an embodiment of the invention.

FIG. 4 illustrates a method for writing parameter codes to registers of mode registers for operational parameters according to an embodiment of the invention.

At step 410, a mode register write operation to mode register 230 is performed to write the parameter code for the control parameter SP-WRITE corresponding to the set point for which new parameter codes for the operating parameters are to be stored is written to register 230(1). For example, with reference to the mode registers 210, 220, and 230 and the operating parameters PARAMA, PARAMB, and PARAMC shown in FIG. 2, a "0" is written to register 230(1) to write parameter codes to registers 210(A0), 220(B0), and 220(C0) for the operating parameters PARAMA, PARAMB, and PARAMC with mode register write operations to mode registers 210 and 220. A "1" is written to register 230(1) to write parameter codes to registers 210(A1), 220(B1), and 220(C1) for the operating parameters PARAMA, PARAMB, and PARAMC with mode register write operations to mode registers 210 and 220.

At step 420, a mode register write operation is performed for mode registers including registers for storing multiple parameter codes for an operating parameter. Based on the logic value of the parameter code for the control parameter SP-WRITE, the control logic circuit 106 controls the writing of parameter codes to the appropriate registers of the mode registers for the operating parameters. The parameter code stored by the register 230(1) for control parameter SP-WRITE determines which of the registers for an operating parameter having multiple stored parameter codes is written by the mode register write operation. For example, assuming a parameter code of "0" was written to the register 230(1) for the control parameter SP-WRITE, a mode register write operation to mode register 210 will cause parameter codes to be written to the register 210(A0) for the operating parameter PARAMA. A mode register write operation to mode register 220 will cause parameter codes to be written to the registers 220(B0) and 220(C0) for the operating parameters PARAMB and PARAMC. Where a parameter code of "1" was written to the register 230(1) for the control parameter SP-WRITE, a mode register write operations to mode registers 210 and 220 will cause parameter codes to be written to registers 210(A1), 220(B1) and 220(C1) for the operating parameters PARAMA, PARAMB, and PARAMC, respectively.

After the parameter codes for the operating parameters are stored by the registers for the multiple set points, the control parameter SP-SELECT of mode register 230 may be used to select which set point of operating parameters are used by the control logic circuit 106 to set a current memory operating condition. For example, a parameter code of "0" may be written to the register 230(1) to select the operating parameters of set point SP0 and a parameter code of "1" may be written to the register 230(1) to select the operating parameters of set point SP.

Figure 5:
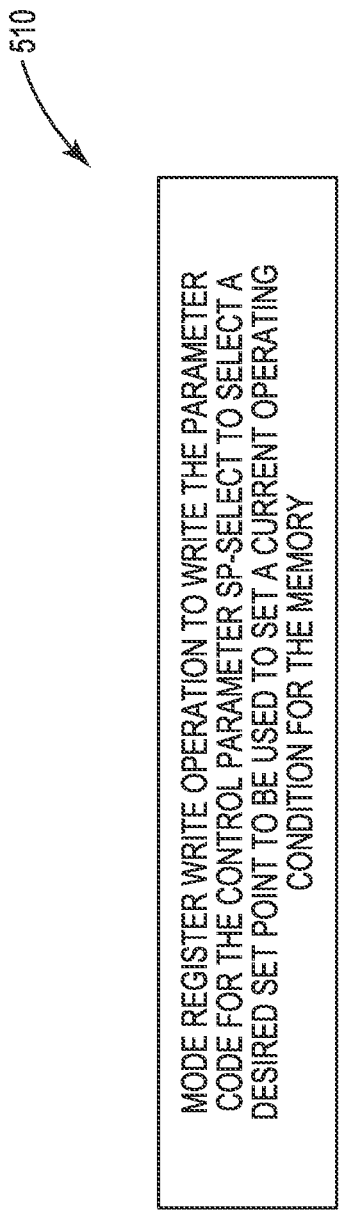
FIG. 5 is a flow diagram for selecting between different set points of operation associated with different operating conditions according to an embodiment of the invention.

FIG. 5 illustrates a process for selecting between different set points of operation associated with different operating conditions, that is, for selecting between the multiple parameter codes that may be stored for various operating parameters according to an embodiment of the invention. In the following example, it is assumed that the parameter codes for the first set point SP0 for the operating parameters PARAMA, PARAMB, and PARAMC set the current operating condition. In some embodiments, following power-up and initialization of the memory, the parameter codes stored for set points SP0 and SP1 are default setting needed to operate in unterminated, low-frequency environments. The default set point may be, as set by the control parameters SP-SELECT and SP-WRITE, the first set point SP0. For example, the current operating condition may be set by the default parameter codes stored for the first set point SP0 following power-up and initialization of the memory, and prior to changing the parameter code for the control parameter SP-SELECT and/or writing parameter codes for the operating parameters.

At step 510, a mode register write operation to mode register 230 is performed to write a parameter code of "1" for the operating parameter SP-SELECT, which selects the parameter codes for operating parameters PARAMA, PARAMB, and PARAMC of the second set point SP1 to set the current operating condition. Based on the logic value of the parameter code for the control parameter SP-SELECT, the control logic circuit 106 uses the corresponding parameter codes. Thus, in the example of a "1" logic value for operating parameter SP-SELECT, the parameter codes stored by registers 210(A1), 220(B1), and 220(C1) for operating parameters PARAMA, PARAMB, and PARAMC, respectively, will be used by the control logic circuit 106 to set the current operating condition rather than the parameter codes stored by registers 210(A0), 220(B0), and 220(C0).

Following the selection of the stored parameter codes for the second set point SP1, the stored parameter codes for the first set point SP0 can be later selected to set the current operating parameters for operation, for example, by using step 510, but writing a parameter code of "0" to the operating parameter SP-SELECT of mode register 230 instead of a parameter code of "1."

As previously described, a memory may be operated at different clock frequencies, such as a relatively high clock frequency when the memory is active, as well as a lower frequency, for example, to conserve power. The memory may need to have different operating parameters for different memory operating conditions for proper operation at the different clock frequencies. A training process may be used to determine operating parameters for the various memory operating conditions. After the operating parameters for the different memory operating conditions are determined, parameter codes representing the operating parameters are written to the mode registers to be stored.

Figure 6:
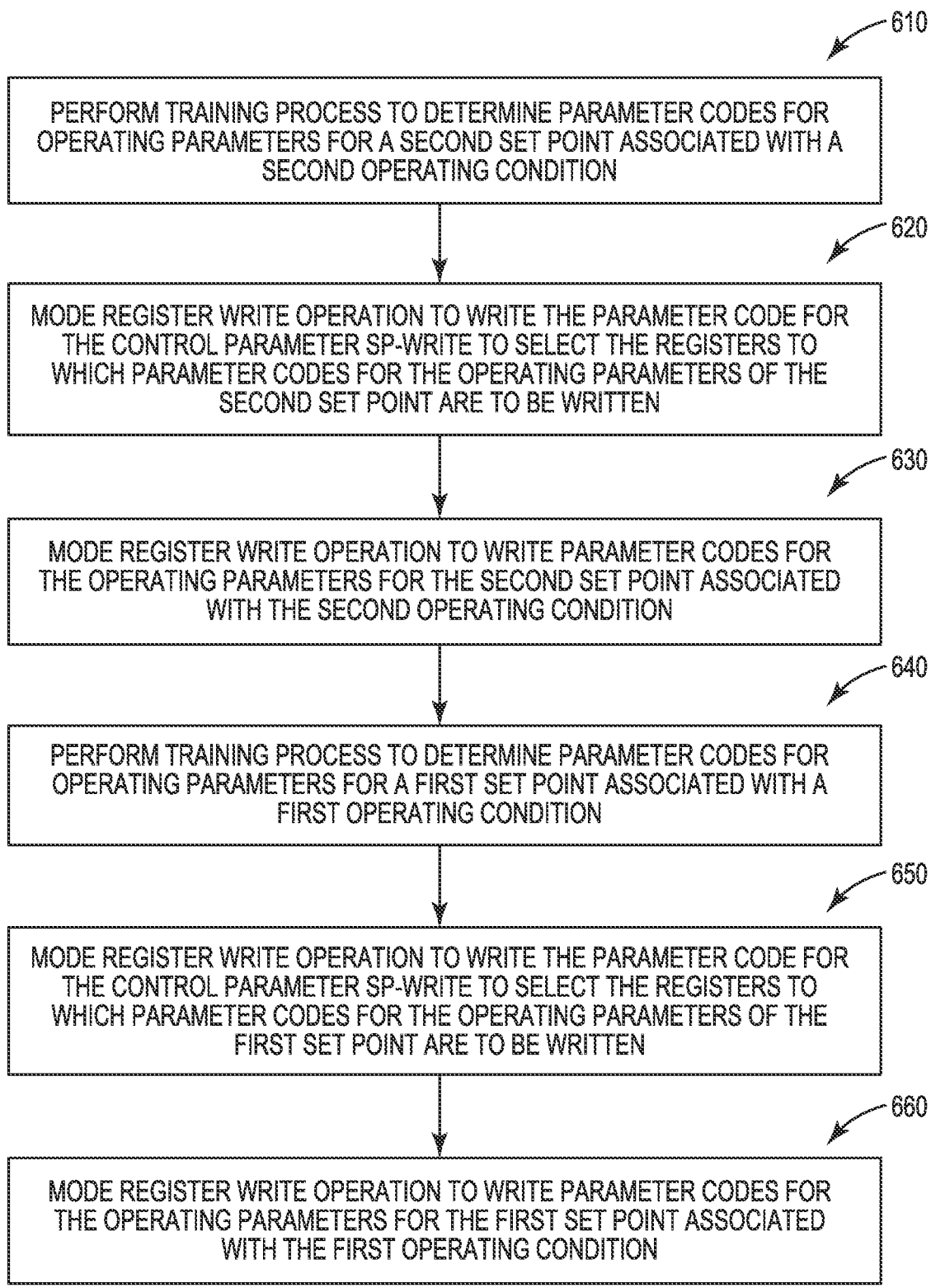
FIG. 6 is a flow diagram for writing parameter codes for operational parameters for two different memory operating conditions according to an embodiment of the invention.

FIG. 6 illustrates a flow diagram for writing parameter codes to the registers for operational parameters PARAMA, PARAMB, and PARAMC for two different memory operating conditions according to an embodiment of the invention. The operating parameters for a first memory operating condition (e.g., for operation at a first clock frequency) are associated with the first set point SP0 and the operating parameters for a second memory operating condition (e.g., for operation at a second clock frequency) are associated with the second set point SP1.

As previously described, a first set point associated with a first memory operating condition may provide default parameter codes that may be used to set a current operating condition following power-up and initialization of the memory. Following power-up and initialization of the memory, at step 610 a training process may be used to determine suitable values for operating parameters PARAMA, PARAMB, and PARAMC for the second memory operating condition, and to determine the parameter codes corresponding to the desired operating parameters PARAMA, PARAMB, and PARAMC. The training process may evaluate performance of the memory based on command, address, and/or data over a range of different signal timings. The voltage ranges of the command, address, and/or data signals may also be varied, and provided with the memory set with different circuit configurations (e.g., on-die termination settings). The command, address, and/or data signals may be provided to the memory, for example, from a memory controller. Conventional training processes known to those ordinarily skilled in the art may be used for the training process to determine values for the operating parameters. In some embodiments, when the memory enters a training mode the control logic circuit 106 will control the control parameter SP-SELECT to set the current memory operating condition to the memory operating condition not being written (e.g., set to the first memory operating condition for training of a second memory operating condition) so that the memory operates according to a known set point during the training process.

At step 620, a mode register write operation to mode register 230 is performed to write the parameter code "1" for the control parameter SP-WRITE to register 230(0). As a result, for subsequent mode register write operations at step 630 for mode registers 210 and 220 the control logic circuit 106 will write the parameter codes determined from training to the registers 210(A1), 220(B1), and 220(C1) for operating parameters PARAMA, PARAMB, and PARAMC. Following the writing of the parameter codes for operating parameters PARAMA, PARAMB, and PARAMC for the second memory operating condition, responsive to writing a parameter code of "1" for the control parameter SP-SELECT of mode register 230 the control logic circuit 106 selects the parameter codes stored by registers 210(A1), 220(B1), and 220(C1) to set a current memory operating condition. In some embodiments, the control logic circuit 106 will control the control parameter SP-SELECT to set the current memory operating condition to the memory operating condition that was just written when the memory exits the training mode (e.g., set to the second memory operating condition after training for the second memory operating condition).

At step 640 a training process may be used to determine operating PARAMA, PARAMB, and PARAMC for the first memory operating condition, and to determine the parameter codes corresponding to the desired operating parameters PARAMA, PARAMB, and PARAMC. At step 650, a mode register write operation to mode register 230 is performed to write the parameter code "0" for the control parameter SP-WRITE to register 230(0). As a result, for subsequent mode register write operations at step 660 for mode registers 210 and 220 the control logic circuit 106 will write the parameter codes determined from training to the registers 210(A0), 220(B0), and 220(C0) for operating parameters PARAMA, PARAMB, and PARAMC. Following the writing of the parameter codes for operating parameters PARAMA, PARAMB, and PARAMC for the first memory operating condition, responsive to writing a parameter code of "0" for the control parameter SP-SELECT of mode register 230 the control logic circuit 106 selects the parameter codes stored by registers 210(A0), 220(B0), and 220(C0) to set a current memory operating condition.

As previously discussed, multiple registers may be included for an operating parameter to store multiple set points of operation. Control parameters of a mode register may be used by the control logic circuit 106 to select which of the set points are used to set a current memory operating condition. In some embodiments, a sufficient number of registers are included in the memory to store the parameter codes for the operating parameter for each set point. For example, enough registers may be included in a memory to store four different parameter codes for an operating parameter, thus allowing selection of one of four different set points for the operating parameter. Including a sufficient number of registers may increase circuit complexity and consume more area, however.

Selection of multiple set points may also be provided by "swapping" parameter codes stored by the registers for an operating parameter, rather than providing sufficient registers to store the parameter codes for every desired set point of the operating parameter. For example, in an embodiment including registers sufficient to store parameter codes for operating parameters for two different set points, selection between the parameter codes for three different set points may be accomplished by writing the parameter codes for a third set point to registers already storing the parameter codes for either a first or second set point, and then selecting the parameter code for the third set point using control parameters.

Figure 7:
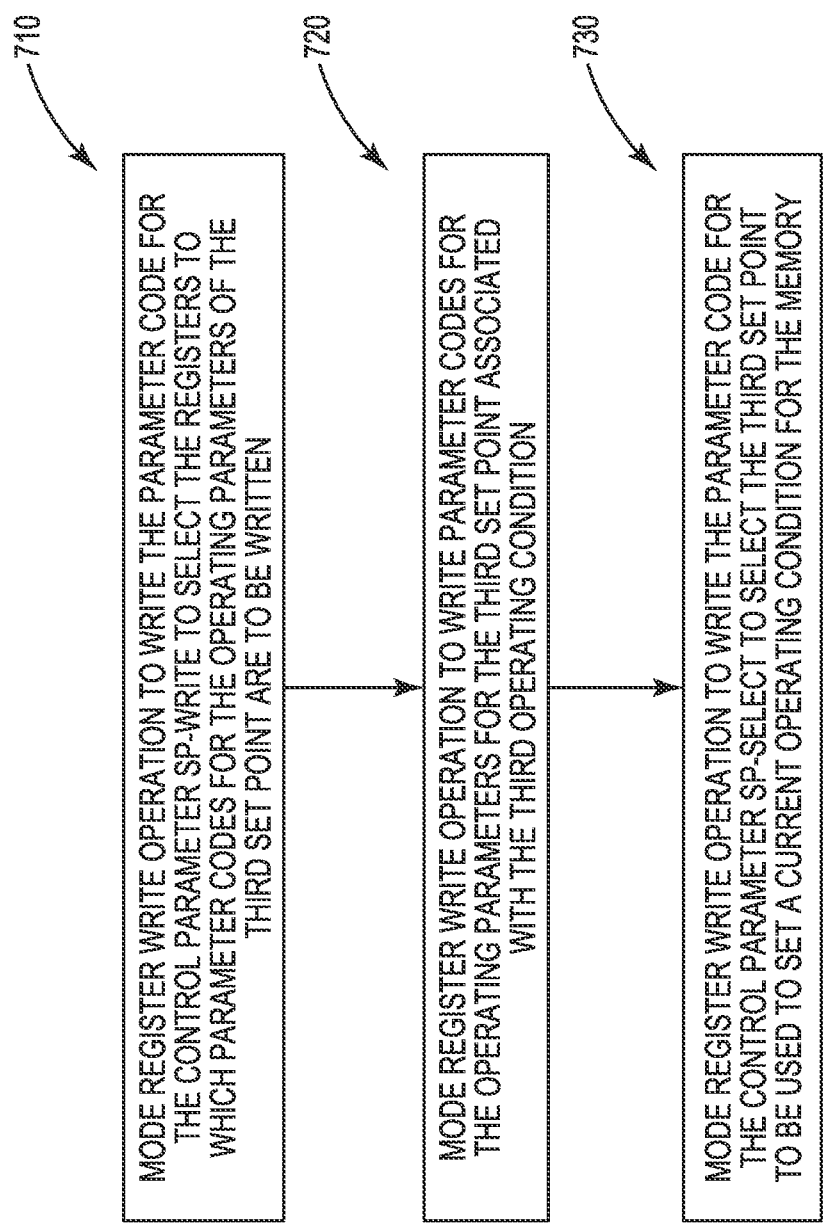
FIG. 7 is a flow diagram for writing parameter codes for operating parameters according to an embodiment of the invention.

FIG. 7 illustrates a process for using the registers of mode registers 210, 220, and 230 for storing parameter codes for a third set point SP2 of operating parameters according to an embodiment of the invention. Prior to the beginning of the process illustrated in FIG. 7, the parameter codes for the third set point SP2 may have already been determined, for example, through a training process for a third memory operating condition. The parameter codes for the third set point SP2 may be stored in memory, and the parameter codes retrieved when writing the parameter codes to the registers of the mode registers 210, 220, and 230. Also, the registers 210(A0), 220(B0), and 220(C0) store the parameter codes for the operating parameters PARAMA, PARAMB, and PARAMC of a first set point SP0, and the registers 210(A1), 220(B1), and 220(C1) store the parameter codes for the operating parameters PARAMA, PARAMB, and PARAMC of a second set point SP1. The current memory operating condition is set using the operating parameters of the second set point SP1 (e.g., a parameter code of "1" is stored in register 230(0) for the control parameter SP-SELECT).

At step 710, a mode register write operation to mode register 230 is performed to store a parameter code of "0" in register 230(1) for the control parameter SP-WRITE so that mode register write operations by the control logic circuit 106 are to mode registers 210 and 220 will write parameter codes to the registers 210(A0), 220(B0), and 220(C0). If the parameter code stored for the control parameter SP-WRITE is already a "0," step 710 may not be performed. At step 720, mode register write operations for mode registers 210 and 220 are performed to write the parameter codes for the operating parameters PARAMA, PARAMB, and PARAMC for the third set point SP2 in registers 210(A0), 220(B0), and 220(C0), overwriting any previous parameter codes stored by these registers for the first set point SP0. At step 730, a mode register write operation is performed for mode register 230 to write a parameter code of "0" in the register 230(0) for the control parameter SP-SELECT. As a result, the control logic circuit 106 uses the parameter codes for operating parameters PARAMA, PARAMB, and PARAMC stored in registers 210(A0), 220(B0), and 220(C0) (i.e., parameter codes for the third set point SP2) to set a current memory operating condition for the memory.

As previously described with reference to the flow diagram of FIG. 7, a third set point SP2 may be selected to set a current memory operating condition although registers of mode registers 210 and 220 store parameter codes for two set points (e.g., registers 210(A0), 220(B0), and 220(C0) for a first set point and registers 210(A1), 220(B1), and 220(C1) for a second set point). While although the parameter codes for the first set point SP0 are overwritten with the parameter codes for the third set point SP2 and additional mode register write operations are needed, as previously described, additional registers specifically included in the memory for storing for the parameter codes of the third set point SP3 are not needed, which may reduce circuit complexity and reduce circuit layout area.

In other embodiments, parameter codes for more than two set points may be stored, but the registers may nonetheless be used for selecting between operating parameters for more set points than can be stored at one time by the mode registers by swapping the parameter codes stored in the registers with those for another set point. The newly written parameter codes for the new set point may then be selected using a control parameter (e.g., SP-SELECT) for setting a current memory operating condition.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for controlling a memory device, the method comprising:
   writing to a first register of a mode register a first parameter code for a burst length operating parameter used to set a first memory operating condition;
   writing to a second register of the mode register a second parameter code for the burst length operating parameter used to set a second memory operating condition; and
   writing a parameter code related to a control parameter to a third register of a second mode register to select between the first and second registers to be written.

2. The method of claim 1, wherein the mode register comprises a first mode register, and the method further comprises writing a parameter code to a fourth register associated with the second mode register to select a stored parameter code for the burst length to set a current operating condition for a memory.

3. The method of claim 1, wherein writing to the first register comprises writing the first parameter code to a mode register address associated with the mode register and wherein writing to the second register associated with the mode register comprises writing the second parameter code to the mode register address associated with the mode register.

4. The method of claim 1, wherein the mode register comprises a first mode register and the method further comprises:
   writing to a first register of a second mode register a first parameter code for an operating parameter;
   writing to a second register of the second e register a second parameter code for the operating parameter; and
   selecting between the first parameter codes and the second parameter codes for the burst length operating parameter and the operating parameter to set a current memory operating condition.

5. The method of claim 4, wherein the operating parameter comprises at least one of a preamble operating parameter, a precharge operating parameter, a postamble operating parameter, a latency parameter, a drive strength parameter, a data bus interface operating parameter, an on-die termination operating parameter, and a voltage reference operating parameter.

6. The method of claim 4, wherein the first parameter codes and the second parameter codes for the burst length operating parameter and the operating parameter are selected simultaneously.

7. The method of claim 1, wherein the mode register comprises a first mode register and wherein writing to a first register of the first mode register a first parameter code for the burst length operating parameter comprises:
   writing a parameter code to a register of the second mode register, the parameter code indicative of writing a parameter code to the first register of the first mode register responsive to a mode register write operation to the first mode register instead of to the second register of the first mode register; and
   commanding a mode register write operation to the first mode register to write the first parameter code.

8. The method of claim 7, wherein the parameter code associated with a first control parameter and the register comprises a first register, and the method further comprises writing a parameter code related to a second control parameter to a second register associated with the second mode register, the second parameter code indicative of using the first parameter code to set a current operation condition for a memory.

9. A method for operating a memory device, comprising:
   receiving a first memory command, the memory device comprising a first mode register comprising a first register and a second register, and a second mode register comprising a third register; and
   performing, responsive to the first memory command being a mode register write command for the first mode register:
      writing a burst length operating parameter associated with the mode register write command for the first mode register to the first register when the third register is at a first write-selection value; or
      writing the burst length operating parameter to the second register when the third register is at a second write-selection value.

10. The method of claim 9, further comprising setting one of a first memory operating condition or a second memory operating condition, the first memory operating condition based, at least in part, on the burst length operating parameter written to the first register and the second memory operating condition based, at least in part, on the burst length operating parameter written to the second register.

11. The method of claim 10, further comprising receiving a clock signal at a first frequency under the first memory operating condition and at a second frequency under the second memory operating condition.

12. The method of claim 10, wherein the burst length operating parameter written to the first register has a value different than the burst length operating parameter written to the second register.

13. The method of claim 9, wherein the first mode register is identified by a first mode register address and the second mode register is identified by a second mode register address.

14. The method of claim 9, further comprising:
   receiving a second memory command; and
   performing, responsive to the second memory command being a mode register write command for the second mode register, writing data associated with the mode register write command for the second mode register to the third register to set the third register to one of the first and second write-selection values.

15. The method of claim 14, wherein the second mode register further comprises a fourth register and the method further comprises:
   setting a first memory operating condition based, at least in part, on the burst length operating parameter written to first register when the fourth register is at a first condition-selection value and a second memory operating condition based, at least in part, on the burst length operating parameter written to second register when the fourth register is at a second condition-selection value.

16. The method of claim 15, wherein the first memory operating condition is associated with a first frequency of a clock signal and the second memory operating condition is associated with a second frequency of the clock signal.

17. A method comprising:
storing in individual ones of a plurality of registers of a first mode register a corresponding plurality of values of a burst length operating parameter; and
selecting a set point from a plurality of set points responsive to a value written to a second mode register, wherein the set point indicates a value of the plurality of values of the burst length operating parameter to be applied for operation of a memory.

18. The method of claim 17, further comprising storing individual ones of a plurality of registers of a third mode register a corresponding plurality of values of an operating parameter, wherein the set point indicates a value of the plurality of values of the operating parameter to be applied for the operation of the memory.

19. The method of claim 18, further comprising applying the value of the plurality of values of the burst length operating parameter and the value of the plurality of values of the operating parameter for the operation of the memory.

20. The method of claim 17, wherein the plurality of set points are associated with different frequencies of operation of the memory.

* * * * *

UNITED STATES PATENT AND TRADEMARK OFFICE
CERTIFICATE OF CORRECTION

PATENT NO. : 11,568,906 B2
APPLICATION NO. : 17/301531
DATED : January 31, 2023
INVENTOR(S) : Dean D. Gans and Daniel C. Skinner It is certified that error appears in the above-identified patent and that said Letters Patent is hereby corrected as shown below:

In the Claims

| Column | Line | Claim | Reads | Should Read |
|--------|------|-------|-------|-------------|
| 13 | 49 | 4 | the second e register | the second mode register |

Signed and Sealed this
Twenty-third Day of January, 2024

Katherine Kelly Vidal
*Director of the United States Patent and Trademark Office*